United States Patent
Wu et al.

(10) Patent No.: US 6,960,530 B2
(45) Date of Patent: Nov. 1, 2005

(54) METHOD OF REDUCING THE ASPECT RATIO OF A TRENCH

(75) Inventors: Chang-Rong Wu, Taipei (TW); Yi-Nan Chen, Taipei (TW); Kuo-Chien Wu, Miaoli (TW); Hung-Chang Liao, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 125 days.

(21) Appl. No.: 10/724,435

(22) Filed: Nov. 28, 2003

(65) Prior Publication Data
US 2004/0203247 A1 Oct. 14, 2004

(30) Foreign Application Priority Data
Apr. 8, 2003 (TW) ........................... 92107985 A

(51) Int. Cl.[7] .............................. H01L 21/302
(52) U.S. Cl. ................ 438/701; 438/424; 438/435; 438/437; 438/696; 438/734; 438/743
(58) Field of Search ................ 438/424, 435, 438/437, 696, 723, 734, 701, 743, 296, 750

(56) References Cited

U.S. PATENT DOCUMENTS

| | | | | |
|---|---|---|---|---|
| 5,610,441 A | * | 3/1997 | Carl et al. | 257/774 |
| 6,255,194 B1 | * | 7/2001 | Hong | 438/435 |
| 6,828,239 B2 | * | 12/2004 | En-Ho et al. | 438/700 |
| 2005/0020027 A1 | * | 1/2005 | Lim et al. | 438/437 |

* cited by examiner

Primary Examiner—George A. Goudreau
(74) Attorney, Agent, or Firm—Quintero Law Office

(57) ABSTRACT

A method of reducing trench aspect ratio. A trench is formed in a substrate. A conformal Si-rich oxide layer is formed on the surface of the trench by HDPCVD. A conformal first oxide layer is formed on the Si-rich oxide layer by HDPCVD. A conformal second oxide layer is formed on the first oxide layer by LPCVD. Part of the Si-rich oxide layer, the second oxide layer and the first oxide layer are removed by anisotropic etching to form an oxide spacer composed of a remaining Si-rich oxide layer, a remaining second oxide layer and a remaining first oxide layer. The remaining second oxide layer, part of the remaining first oxide layer and part of the Si-rich oxide layer are removed by BOE. Thus, parts of the remaining first and Si-rich oxide layers are formed on the lower surface of the trench, thereby reducing the trench aspect ratio.

20 Claims, 5 Drawing Sheets

METHOD OF REDUCING THE ASPECT RATIO OF A TRENCH

BACKGROUND OF THE INVENTION

1. Field of the Invention

The present invention relates to a semiconductor manufacturing process, and more particularly, to a method of reducing the aspect ratio of a trench.

2. Description of the Related Art

Semiconductor device geometry continues to decrease in size, providing more devices per fabricated wafer. Currently, some devices are fabricated with less than 0.25 μm spacing between features; in some cases there is as little as 0.18 μm spacing between features, which often takes the form of a trench.

An isolation technique called shallow trench isolation (STI) has been introduced to the fabrication of devices to reduce size. Isolation trenches are formed in a substrate between features, such as transistors. FIGS. 1A–1B are schematic views of a traditional STI process.

In FIG. 1A, a substrate 10 such as a silicon wafer is provided. A shield layer 11 composed of a pad oxide layer 12 and a silicon nitride layer 14 is formed on part of the substrate 10. The shield layer 11 serves as a stacked mask defining an isolation area in the substrate 10. The pad oxide layer 12 can be a $SiO_2$ layer with a thickness of 50~150 Å, formed by chemical vapor deposition (CVD) or thermal oxidation. The silicon nitride layer 14 can be a $Si_3N_4$ layer with a thickness of 800~1500 Å, formed by CVD.

In FIG. 1B, using the shield layer 11 as a mask, part of the substrate 10 is etched to form a trench 15. A thin oxide film 16, serving as a linear layer, is then formed by thermal oxidation, conformal to the surface of the trench 15. The thickness of the thin oxide film 16 is about 180~220 Å. Next, a trench-filling material such as a $SiO_2$ layer 18 is deposited in the trench 15 once with a conventional high-density plasma chemical vapor deposition (HDP-CVD). Typically, the HDP-CVD reaction gas includes $O_2$ and silane ($SiH_4$).

FIG. 1C shows that a void may form when a trench with a narrow gap is filled by traditional process. For example, when the width of the trench 15 is less than 0.15 μm and/or the aspect ratio of the trench is greater than 4, a void 20 is easily formed in a $SiO_2$ layer 19 with the traditional process. Such a void 20 seriously affects device reliability and yield, and hinders reduction in semiconductor device geometry.

SUMMARY OF THE INVENTION

The object of the present invention is to provide a method of forming a shallow trench isolation (STI) in a substrate.

Another object of the present invention is to provide a method for lowering the aspect ratio of a trench during a deposition process to fill the trench without creating voids.

In order to achieve these objects, the present invention provides a method of reducing the aspect ratio of a trench. A trench is formed in a substrate. A conformal first insulating layer is formed on a surface of the trench. A conformal second insulating layer is formed on the first insulating layer. A conformal third insulating layer is formed on the second insulating layer. The first, second and third insulating layers are anisotropically etched to form a remaining first insulating layer on a sidewall of the trench, a remaining second insulating layer on the remaining first insulating layer and a remaining third insulating layer on the remaining second insulating layer. By performing an etching procedure, the remaining third insulating layer is removed at a third etching rate, part of the remaining second insulating layer is removed at a second etching rate and part of the remaining first insulating layer is removed at a first etching rate. The third etching rate is greater than the second etching rate and the second etching rate is greater than the first etching rate.

The present invention improves on the prior art in that the present method forms an insulating spacer on the sidewall of the trench and thus produces a triple "U" shaped trench rather than the conventional single "U" shaped trench. Thus, the invention can reduce the aspect ratio of the trench, thereby preventing void formation during trench filling and ameliorating the disadvantages of the prior art.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

A preferred embodiment of the invention will now be described in detail with reference to the accompanying drawings. FIGS. 2~9 are sectional views showing the trench isolation process of the present invention.

Figure 1A:
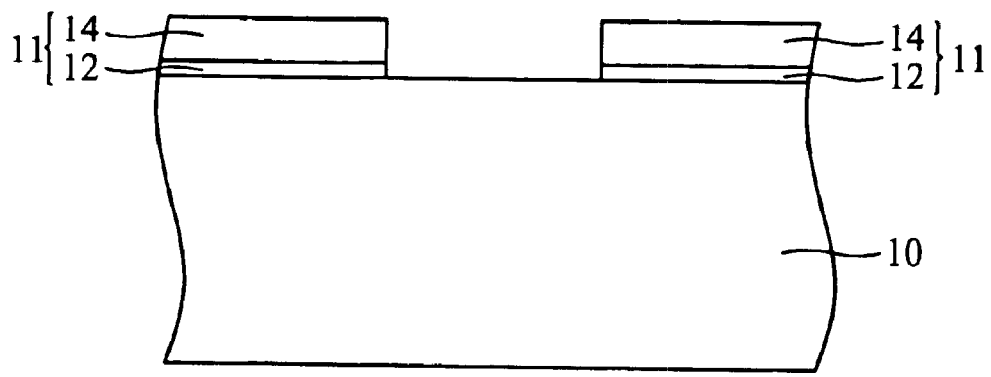
FIGS. 1A~1B are sectional views according to the conventional STI process.
Figure 1B:
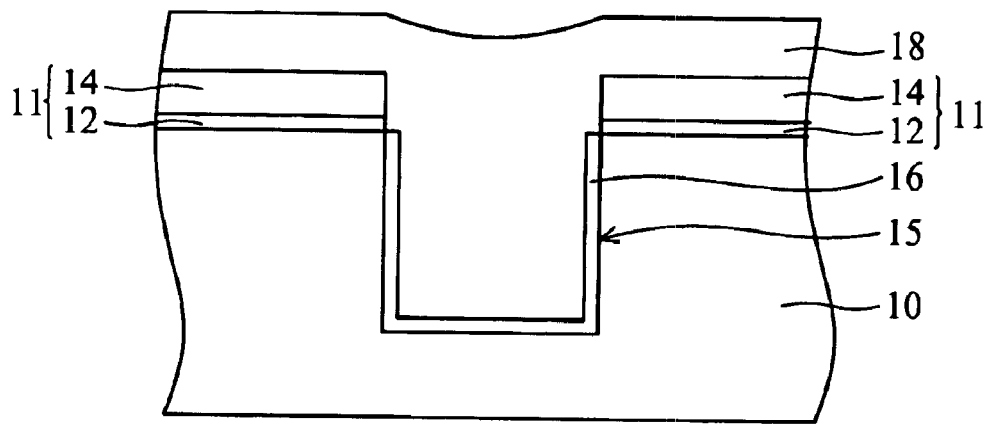
Figure 1C:
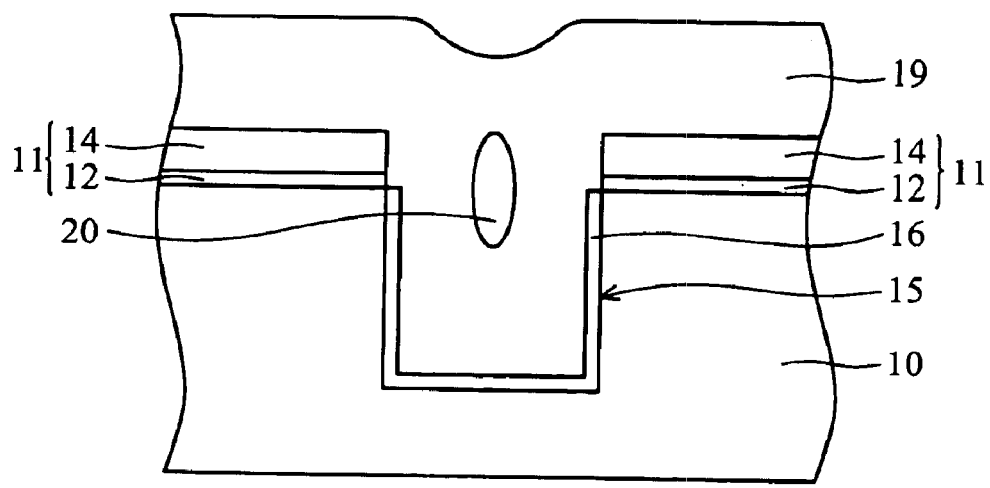
FIG. 1C is a schematic view, according to the conventional STI process, that forms a void in a trench.
Figure 2:
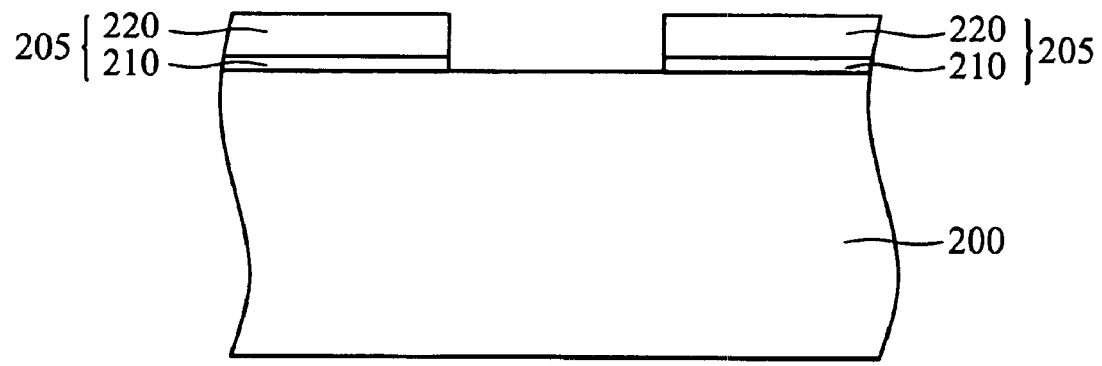
FIGS. 2~9 are sectional views according to an embodiment of the present invention.

In FIG. 2, a semiconductor substrate 200, such as a silicon wafer, is provided. A shield layer 205 preferably composed of a pad oxide layer 210 and a silicon nitride layer 220 is formed on part of the substrate 200. The pad oxide layer 210 can be a $SiO_2$ layer formed by thermal oxidation or CVD (chemical vapor deposition). The silicon nitride layer 220 can be a $Si_3N_4$ layer formed by CVD. For example, the thickness of the pad oxide layer 210 is about 100 Å and the thickness of the silicon nitride layer 220 is about 900 Å. The shield layer 205 serves as a stacked mask for defining an isolation area in the substrate 200.

Figure 3:
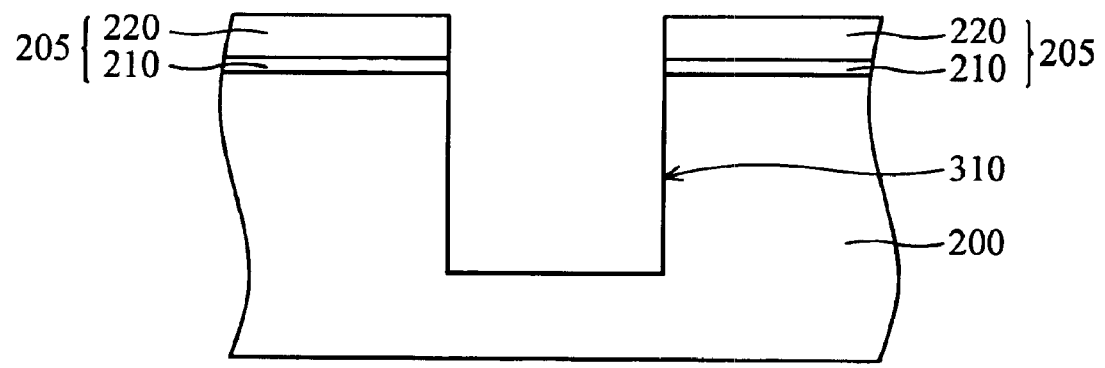

In FIG. 3, using the shield layer 205 as a mask, part of the substrate 200 is etched to form a trench 310. The depth of the trench 310 is, for example, 2600~5000 Å. Moreover, a thin oxide film (not shown), such as a $SiO_2$ film, can be conformably formed on the side and the bottom of the trench 310 by thermal oxidation. The thin oxide film (not shown) serves as a linear layer of about 180–220 Å in thickness. In order to simplify the illustration, the thin oxide film (or the linear layer) is not shown in FIGS. 2–9.

Figure 4:
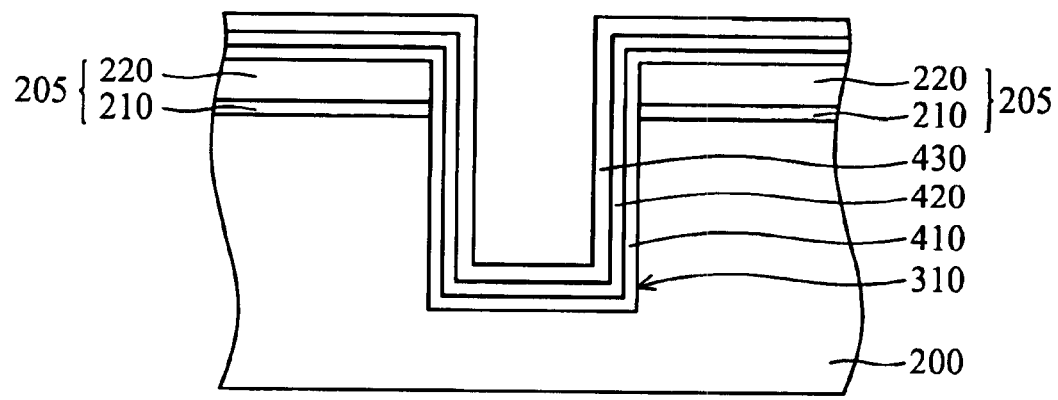

In FIG. 4, using HDP-CVD, a conformal Si-rich oxide layer 410 is formed on the surface of the trench 310. The thickness of the Si-rich layer 410 is about 50~100 Å.

In FIG. 4, using HDP-CVD, a conformal first silicon oxide layer 420, such as a $SiO_2$ layer, is formed on the Si-rich oxide layer 410. The thickness of the first oxide layer 420 is about 50~120 Å.

In FIG. 4, using low pressure chemical vapor deposition (LP-CVD), a conformal second silicon oxide layer 430, such as a TEOS-$SiO_2$ layer, is formed on the first silicon oxide layer 420. That is, the LP-CVD reaction gas can be TEOS (tetra-ethyl-ortho-silicate). The thickness of the second oxide layer is about 50~150 Å.

Figure 5:
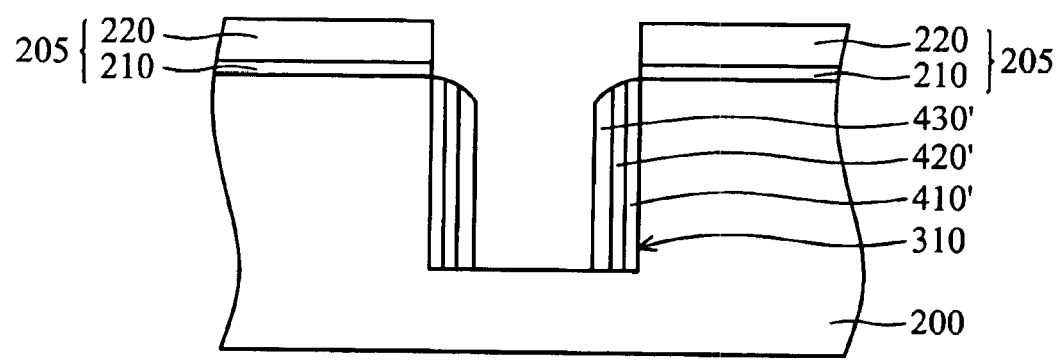

In FIG. 5, the Si-rich oxide layer 410, the second oxide layer 420 and the first oxide layer 430 are partially etched back by anisotropic etching. Thus, a remaining Si-rich oxide layer 410' is left on the sidewall of the trench 310, a remaining first silicon oxide layer 420' is left on the remaining Si-rich layer 410' and a remaining second silicon oxide layer 430' is left on the remaining first silicon oxide layer 420'. The above described step forms a multi-oxide spacer on the side surface of the trench 310, wherein the multi-oxide spacer is composed of a remaining Si-rich oxide layer 410', a remaining second oxide layer 420' and a remaining first oxide layer 430'. The anisotropic etching can be a plasma etching procedure using $CF_4$-containing gas. It should be noted that the remaining Si-rich oxide layer 410', the remaining first silicon oxide layer 420' and the remaining second silicon oxide layer 430' are lower than the top surface of the substrate 200.

Figure 6:
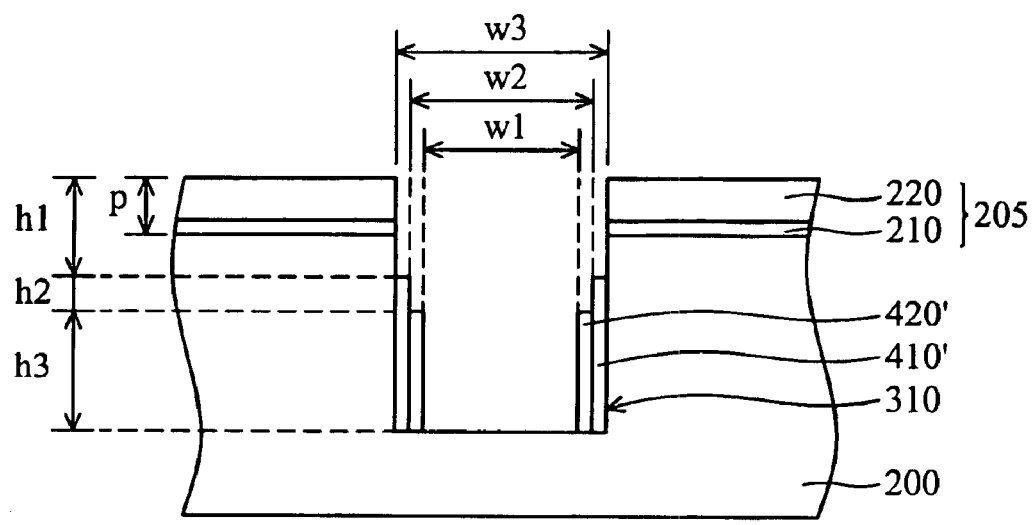

In FIG. 6, by etching with a buffer oxide etcher (BOE) solution, the remaining second silicon oxide layer 430' is removed at a third etching rate, part of the remaining first silicon oxide layer 420' is removed at a second etching rate and part of the remaining Si-rich oxide layer 410' is removed at a first etching rate. The etching procedure can be performed at a time mode. The third etching rate is greater than the second etching rate and the second etching rate is greater than the first etching rate. Accordingly, a triple "U" shaped trench is formed and thus reduces the trench aspect ratio.

For example, the etching procedure uses a BOE solution consisting of $NH_4F$ (40%), HF (49%) and dionized water (DI). The volume ratio of $NH_4F/HF/DI$ is about 5/1/48. The third etching rate is about 800 Å/min, the second etching rate is 400 Å/min and the first etching rate is 200 Å/min. The etching time is about 30 seconds.

Here, a demonstration of the present invention is provided, illustrating the reduced trench aspect ratio. Subsequent to the present process, referring to FIG. 6, it is assumed that:
P=1000 Å, w1=500 Å, w2=700 Å, w3=800 Å, h1=1100 Å, h2=100 Å, h3=2700 Å.
The original aspect ratio (AR)
=(h1+h2+h3)/w3=3900/800
=4.87
Subsequent to the present process, the aspect ratio (AR')
=AR*(w3*h1+w2*h2+w1*h3)/w3*(h1+h2+h3)
=4.87*[(800*1100+700*100+500*2700)/(800*3900)]
=4.87*0.737
=3.59

Figure 7:
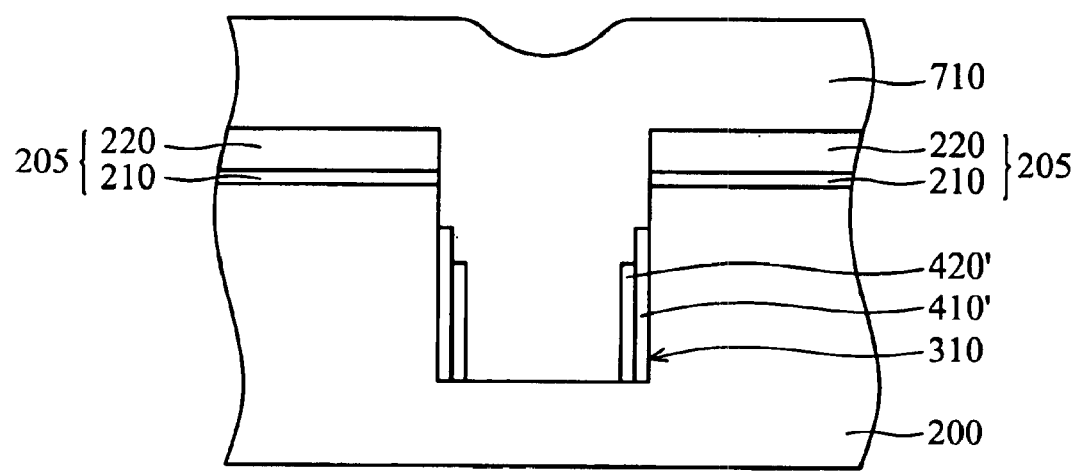

Next, referring to FIG. 7, using HDP-CVD or TEOS-CVD, the trench 310 is filled with an insulation layer 710 extending onto the shield layer 205. The insulation layer 710 is, for example, a $SiO_2$ layer. Due to the lower aspect ratio of the trench 310 according to the present method, void-free deposition is easily achieved.

Figure 8:
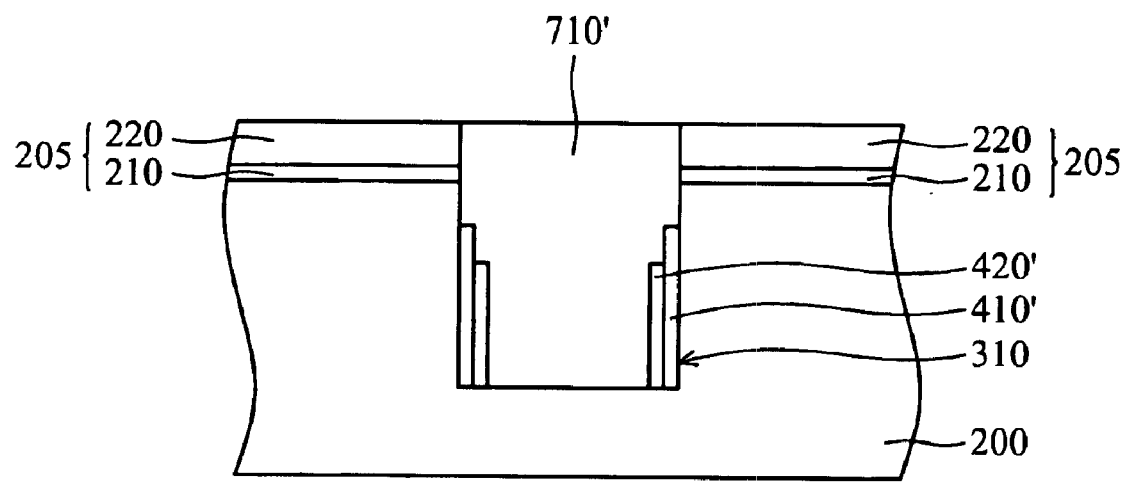

In FIG. 8, a planarization such as chemical mechanical polishing (CMP) is performed on the insulation layer 710 to produce a smooth insulation layer 710', wherein the shield layer 205 serves as a stop layer for the planarization.

Figure 9:
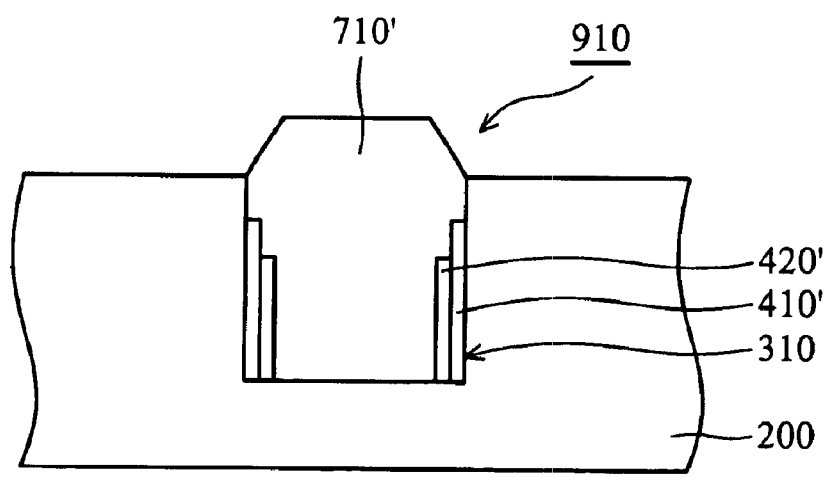

In FIG. 9, the silicon nitride layer 220 is removed by, for example, a phosphoric acid solution. The pad oxide layer 210 is removed by, for example, an HF solution. Thus, a void-free STI profile 910 is formed.

Thus, the present invention provides a method of forming void-free STI in a substrate, and a method of lowering the aspect ratio of a trench during a deposition process filling the trench. Additionally, the present invention significantly improves the reliability of the product and achieves the goal of IC reduction.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of reducing an aspect ratio of a trench, comprising the steps of:
    forming a trench in a substrate;
    forming a conformal first insulating layer on a surface of the trench;
    forming a conformal second insulating layer on the first insulating layer;
    forming a conformal third insulating layer on the second insulating layer;
    anisotropically etching the first, second and third insulating layers to form a remaining first insulating layer on a sidewall of the trench, a remaining second insulating layer on the remaining first insulating layer and a remaining third insulating layer on the remaining second insulating layer; and
    performing an etching procedure with an etchant to remove the remaining third insulating layer at a third etching rate, part of the remaining second insulating layer at a second etching rate and part of the remaining first insulating layer at a first etching rate;
    wherein the third etching rate is greater than the second etching rate and the second etching rate is greater than the first etching rate.

2. The method according to claim 1, wherein the remaining first insulating layer, the remaining second insulating layer and the remaining third insulating layer are lower than a top surface of the substrate.

3. A method of reducing an aspect ratio of a trench, comprising the steps of:
    forming a trench in a substrate;
    using HDP-CVD to form a conformal Si-rich oxide layer on a surface of the trench;
    using HDP-CVD to form a conformal first oxide layer on the Si-rich oxide layer;
    using LP-CVD to form a conformal second oxide layer on the first oxide layer;
    anisotropically etching the Si-rich oxide layer, the first oxide layer and the second oxide layer to form a remaining Si-rich oxide layer on a sidewall of the trench, a remaining first oxide layer on the remaining Si-rich layer and a remaining second oxide layer on the remaining first oxide layer; and
    performing an etching procedure with an etchant to remove the remaining second oxide layer at a third etching rate, part of the remaining first oxide layer at a second etching rate and part of the remaining Si-rich oxide layer at a first etching rate;
    wherein the third etching rate is greater than the second etching rate and the second etching rate is greater than the first etching rate.

4. The method according to claim 3, wherein the remaining Si-rich oxide layer, the remaining first oxide layer and the remaining second oxide layer are lower than a top surface of the substrate.

5. The method according to claim 3, wherein the formation of the trench comprises the steps of:

forming a shield layer on part of the substrate; and using the shield layer as a mask, etching part of the substrate to define the trench therein.

6. The method according to claim 5, wherein the shield layer comprises a pad oxide layer and a silicon nitride layer.

7. The method according to claim 3, further comprising, before forming the Si-rich layer, a step of:

forming a conformal linear layer on the surface of the trench.

8. The method according to claim 3, wherein the first oxide layer is a $SiO_2$ layer formed by HDP-CVD.

9. The method according to claim 3, wherein the second oxide layer is a TEOS-$SiO_2$ layer formed by LP-CVD.

10. The method according to claim 3, wherein the etchant is a BOE solution.

11. The method according to claim 10, wherein the third etching rate is 800 Å/min, the second etching rate is 400 Å/min and the first etching rate is 200 Å/min.

12. The method according to claim 3, wherein a thickness of the Si-rich layer is 50~100 Å, a thickness of the first oxide layer is 100~120 Å and a thickness of the second oxide layer is 100~150 Å.

13. A method of reducing an aspect ratio of a trench, comprising the steps of:

forming a trench in a Si substrate;

using HDP-CVD, forming a conformal Si-rich oxide layer on a surface of the trench, wherein a thickness of the Si-rich layer is 50~100 Å;

using HDP-CVD, forming a conformal first silicon oxide layer on the Si-rich oxide layer, wherein a thickness of the first oxide layer is 50~120 Å;

using LP-CVD, forming a conformal second silicon oxide layer on the first silicon oxide layer, wherein a thickness of the second oxide layer is 100~150 Å;

anisotropically etching the Si-rich oxide layer, the first silicon oxide layer and the second silicon oxide layer to form a remaining Si-rich oxide layer on a sidewall of the trench, a remaining first silicon oxide layer on the remaining Si-rich layer and a remaining second silicon oxide layer on the remaining first silicon oxide layer; and performing an etching procedure with a BOE solution to remove the remaining second silicon oxide layer at a third etching rate, part of the remaining first silicon oxide layer at a second etching rate and part of the remaining Si-rich oxide layer at a first etching rate;

wherein the third etching rate is greater than the second etching rate and the second etching rate is greater than the first etching rate.

14. The method according to claim 13, wherein the remaining Si-rich oxide layer, the remaining first silicon oxide layer and the remaining second silicon oxide layer are lower than a top surface of the silicon substrate.

15. The method according to claim 13, wherein the formation of the trench comprises the steps of:

forming a shield layer on part of the silicon substrate; and using the shield layer as a mask, etching part of the silicon substrate to define the trench therein.

16. The method according to claim 15, wherein the shield layer comprises a pad oxide layer and a silicon nitride layer.

17. The method according to claim 13, further comprising, before forming the Si-rich layer, a step of:

forming a conformal linear layer on the surface of the trench.

18. The method according to claim 13, wherein the first silicon oxide layer is a $SiO_2$ layer formed by HDP-CVD.

19. The method according to claim 13, wherein the second silicon oxide layer is a TEOS-$SiO_2$ layer formed by LP-CVD.

20. The method according to claim 13, wherein the third etching rate is 800 Å/min, the second etching rate is 400 Å/min and the first etching rate is 200 Å/min.

* * * * *